(12) United States Patent
Chen et al.

(10) Patent No.: US 8,742,967 B2
(45) Date of Patent: Jun. 3, 2014

(54) ANALOG TO DIGITAL CONVERTER

(71) Applicant: Raydium Semiconductor Corporation, Hsinchu (TW)

(72) Inventors: Chien-Ming Chen, Tainan (TW); Hui-Wen Miao, Hsinchu (TW); Ko-Yang Tso, New Taipei (TW)

(73) Assignee: Raydium Semiconductor Corporation, Hsinchu (TW)

( * ) Notice: Subject to any disclaimer, the term of this patent is extended or adjusted under 35 U.S.C. 154(b) by 0 days.

(21) Appl. No.: 13/920,126

(22) Filed: Jun. 18, 2013

(65) Prior Publication Data

US 2014/0002290 A1    Jan. 2, 2014

(30) Foreign Application Priority Data

Jun. 29, 2012  (TW) .............................. 101123508 A

(51) Int. Cl.
| | |
|---|---|
| *H03M 1/66* | (2006.01) |
| *H03M 1/00* | (2006.01) |
| *H03M 1/12* | (2006.01) |
| *G09G 3/36* | (2006.01) |
| *G09G 3/34* | (2006.01) |

(52) U.S. Cl.
CPC . *H03M 1/00* (2013.01); *H03M 1/12* (2013.01); *G09G 2320/0276* (2013.01); *G09G 3/3648* (2013.01); *G09G 3/346* (2013.01); *G09G 3/3688* (2013.01); *G09G 2330/021* (2013.01); *G09G 3/3614* (2013.01)
USPC .......................................... 341/145; 345/690

(58) Field of Classification Search
CPC .. H03M 1/00; H03M 1/12; G09G 2320/0276; G09G 3/3648; G09G 3/346; G09G 3/3688; G09G 2330/021; G09G 3/3614
USPC .................. 341/145, 122, 148, 150, 153, 155
See application file for complete search history.

(56) References Cited

U.S. PATENT DOCUMENTS

| | | | |
|---|---|---|---|
| 6,326,913 B1 | 12/2001 | Chao et al. | |
| 2011/0102471 A1* | 5/2011 | Hsu et al. | ...................... 345/690 |

FOREIGN PATENT DOCUMENTS

TW    I335731    1/2011

OTHER PUBLICATIONS

English Abstract translation of TWI335731 (Published Jan. 1, 2011).

* cited by examiner

*Primary Examiner* — Joseph Lauture

(57) ABSTRACT

An analog to digital converter generating a number of corresponding voltages in response to a number of values of a grey level is provided. The analog to digital converter includes a decoder and an operational amplifier. The decoder provides first to third output voltages having the same level when w most significant bits (MSBs) of the grey level correspond to the same value, provides first and second intermediate voltages in response to the x MSBs next to the w MSBs when the w MSBs correspond to different values, and selectively has the first to the third output voltages equal to one of the first and the second intermediate voltages. The operational amplifier obtains a pixel voltage by interpolating the first to the third output voltages, wherein the sum of w and x is smaller than or equal to the bit number of the gray level.

9 Claims, 7 Drawing Sheets

| grey level | bit | | | | | | | | control signal | | |
|---|---|---|---|---|---|---|---|---|---|---|---|
| | DT7 | DT6 | DT5 | DT4 | DT3 | DT2 | DT1 | DT0 | DTC | DTD | DTB |
| 0~31 | 0 | 0 | 0 | DT4~DT0 | | | | | ✕ | ✕ | ✕ |
| 32 | 0 | 0 | 1 | 0 | 0 | 0 | 0 | 0 | 1 | 0 | 0 |
| 33 | 0 | 0 | 1 | 0 | 0 | 0 | 0 | 1 | 1 | 0 | 0 |
| 34 | 0 | 0 | 1 | 0 | 0 | 0 | 1 | 0 | 1 | 0 | 0 |
| 35 | 0 | 0 | 1 | 0 | 0 | 0 | 1 | 1 | 1 | 0 | 0 |
| 36 | 0 | 0 | 1 | 0 | 0 | 1 | 0 | 0 | 0 | 0 | 1 |
| 37 | 0 | 0 | 1 | 0 | 0 | 1 | 0 | 1 | 0 | 0 | 1 |
| 38 | 0 | 0 | 1 | 0 | 0 | 1 | 1 | 0 | 0 | 0 | 1 |
| 39 | 0 | 0 | 1 | 0 | 0 | 1 | 1 | 1 | 0 | 0 | 1 |
| 40 | 0 | 0 | 1 | 0 | 1 | 0 | 0 | 0 | 0 | 0 | 1 |
| 41 | 0 | 0 | 1 | 0 | 1 | 0 | 0 | 1 | 0 | 0 | 1 |
| 42 | 0 | 0 | 1 | 0 | 1 | 0 | 1 | 0 | 0 | 0 | 1 |
| 43 | 0 | 0 | 1 | 0 | 1 | 0 | 1 | 1 | 0 | 0 | 1 |
| 44 | 0 | 0 | 1 | 0 | 1 | 1 | 0 | 0 | 0 | 1 | 0 |
| 45 | 0 | 0 | 1 | 0 | 1 | 1 | 0 | 1 | 0 | 1 | 0 |
| 46 | 0 | 0 | 1 | 0 | 1 | 1 | 1 | 0 | 0 | 1 | 0 |
| 47 | 0 | 0 | 1 | 0 | 1 | 1 | 1 | 1 | 0 | 1 | 0 |
| 48 | 0 | 0 | 1 | 1 | 0 | 0 | 0 | 0 | 0 | 1 | 0 |
| ⋮ | ⋮ | ⋮ | ⋮ | ⋮ | ⋮ | ⋮ | ⋮ | ⋮ | ⋮ | ⋮ | ⋮ |
| 224~255 | 1 | 1 | 1 | DT4~DT0 | | | | | ✕ | ✕ | ✕ |

FIG. 5A

| grey level | intermediate voltage | | | | output voltage | | |
| --- | --- | --- | --- | --- | --- | --- | --- |
| | A | B | D | E | O3 | O2 | O1 |
| 0~31 | don't care | | | | D | D | D |
| 32 | L36 | L32 | | | B | B | B |
| 33 | L36 | L32 | | | B | A | B |
| 34 | L36 | L32 | | | B | B | A |
| 35 | L36 | L32 | | | B | A | A |
| 36 | L36 | L32 | | | A | A | A |
| 37 | L36 | L40 | | | A | B | A |
| 38 | L36 | L40 | | | A | A | B |
| 39 | L36 | L40 | | | A | B | B |
| 40 | L44 | L40 | don't care | don't care | B | B | B |
| 41 | L44 | L40 | | | B | A | B |
| 42 | L44 | L40 | | | B | B | A |
| 43 | L44 | L40 | | | B | A | A |
| 44 | L44 | L48 | | | A | A | A |
| 45 | L44 | L48 | | | A | B | A |
| 46 | L44 | L48 | | | A | A | B |
| 47 | L44 | L48 | | | A | B | B |
| 48 | L52 | L48 | | | B | B | B |
| ⋮ | ⋮ | ⋮ | | | ⋮ | ⋮ | ⋮ |
| 224~255 | don't care | | | L224~L255 | E | E | E |

ANALOG TO DIGITAL CONVERTER

This application claims the benefit of Taiwan application Serial No. 101123508, filed Jun. 29, 2012, the subject matter of which is incorporated herein by reference.

BACKGROUND OF THE INVENTION

1. Field of the Invention

The invention relates in general to an analog to digital converter, and more particularly to an analog to digital converter capable of finding an analog value corresponding to a partial range of a digital value by executing interpolation.

2. Description of the Related Art

With the rapid advance in technology, liquid crystal display has been widely used in various electronic display products such as TVs, computer monitors, notebook computers, mobile phones and personal digital assistants. A data driver of the liquid crystal display includes an analog to digital converter providing a pixel voltage to the liquid crystal display panel according to the values of a grey level. A scan driver of the liquid crystal display is used for scanning the pixel voltage to each pixel of the liquid crystal display panel so as to display an image.

Since the relationship between a pixel voltage and its corresponding values of a grey level is non-linear, the conventional analog to digital converter converts the grey level into the pixel voltage through a Gamma voltage resistor string and subsequently inputs the pixel voltage to the liquid crystal display panel. However, as the display quality required of the liquid crystal display is getting higher and higher, the bit number of the grey level and the grade of the Gamma voltage resistor string increase dramatically. As the analog to digital converter requires a large circuit area, the cost is increased accordingly. The conventional design of down-sizing the analog to digital converter by using interpolation for each digital code has the shortcomings that the pixel voltage has larger error, and the liquid crystal display has poorer display quality.

SUMMARY OF THE INVENTION

The invention is directed to an analog to digital converter and a method thereof. The present invention effectively resolves the shortcomings of the conventional technology such as the circuit area being too large, the cost being too high, and the error of pixel voltage being too large due to the interpolation of total digital code. Instead, the present invention has the advantages of having smaller circuit area, lower cost, and smaller error of pixel voltage and providing better display quality to the liquid crystal display using the analog to digital converter and method of the invention.

According to an embodiment of the present invention, an analog to digital converter generating a number of corresponding voltages in response to a number of values of a grey level is provided, wherein the grey level includes k bits with k being a natural number larger than 1. The analog to digital converter includes a decoding device and an operational amplifier. The decoding device includes first to fourth decoding circuits and a logic operation circuit. The first decoding circuit provides first to third output voltages having the same level when w most significant bits (MSBs) of the grey level correspond to the same logic value. The second decoding circuit provides a first intermediate voltage in response to x MSBs next to the w MSBs when the w MSBs correspond to different logic values. The logic operation circuit generates first to third logic control signals according to the x MSBs and y MSBs next to the x MSB. The third decoding circuit generates a second intermediate voltage in response to the x MSBs and the first to the third logic control signals when the w MSBs correspond to different logic values. The fourth decoding circuit selectively has first to third output voltages equal to one of the first and the second intermediate voltages according to y MSBs and z MSBs next to the y MSBs when the w MSBs correspond to different logic values. The operational amplifier generates a pixel voltage according to the first to the third output voltages when the w MSBs correspond to different logic values, wherein the level of the pixel voltage ranges between the first and the second intermediate voltages, and w, x, y and z are natural numbers satisfying the condition: $w+x+y+z \leq k$.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIGS. 5A and 5B each show true tables of the decoding device 21 of FIG. 1.

DETAILED DESCRIPTION OF THE INVENTION

Figure 1:
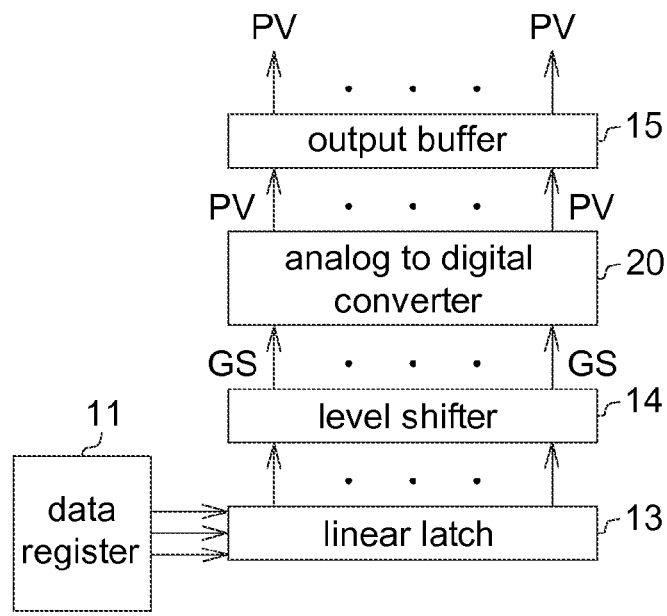
FIG. 1 shows a block diagram of an analog to digital converter according to an embodiment of the invention.
Figure 2:
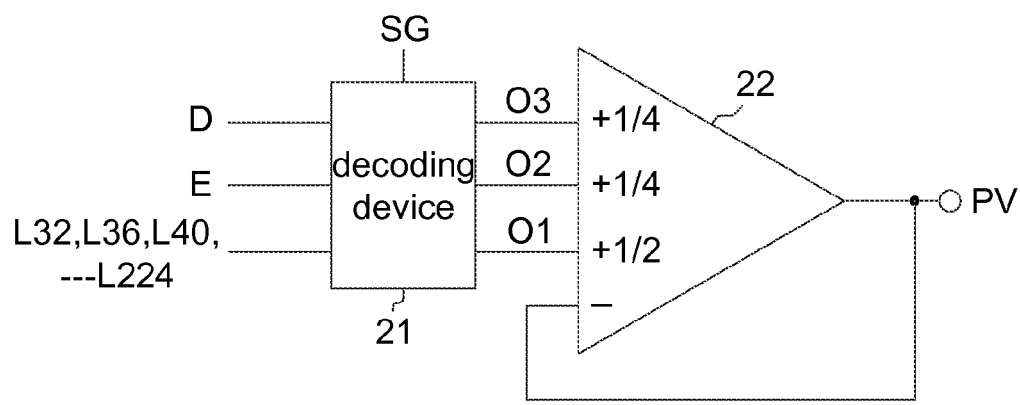
FIG. 2 shows a block diagram of a data driver using the analog to digital converter of the invention.

Referring to FIG. 1 and FIG. 2. FIG. 1 shows a block diagram of an analog to digital converter according to an embodiment of the invention. FIG. 2 shows a block diagram of a data driver using the analog to digital converter of the invention. The analog to digital converter 20 is used in a data driver 10 for converting a grey level GS processed by the hardware (such as the data register 11, the linear latch 13 and the level shifter 14) of the data driver 10 to obtain a corresponding pixel voltage PV. Then, the pixel voltage PV is outputted to the liquid crystal display panel (not illustrated) through the output buffer 15.

The analog to digital converter 20 controls the pixel voltage PV to correspond to a number of voltage levels respectively in response to a number of values of the grey level GS, wherein the grey level GS such as has k bits DTk−1, DT2, . . . , DT0 with k being a natural number larger than 1. The analog to digital converter 20 includes a decoding device 21 and an operational amplifier 22.

The operational amplifier 22 generates the pixel voltage PV according to output voltages O1, O2 and O3, wherein the level of the pixel voltage PV ranges between the levels of the output voltages O1~O3. For example, the operational amplifier 22 of the present embodiment generates the pixel voltage PV by executing the nearest neighbor interpolation, and the level of the pixel voltage PV is obtained by weighting the levels of the output voltages O1~O3 with weights ½, ¼ and ¼ respectively and summing the weighted results.

The decoding device 21 provides the output voltages O1~O3 in response to the grey level GS. In an example, the decoding device 21 divides the value range of the grey level GS into a first value group and a second value group. When the value of the grey level GS is within the first value group, the decoding device 21 provides the output voltages O1~O3 substantially having the same level, and the analog to digital converter 20 does not possess interpolation function.

When the value of the grey level GS is within the second value group, the decoding device 21 makes a part or a totality of the output voltages O1~O3 corresponds to different levels, such that the analog to digital converter 20 can generate the pixel voltage PV by interpolating the levels of the output voltages O1~O3.

Thus, the analog to digital converter 20 can flexibly choose a more linear segment and a more non-linear segment from the Gamma curve of grey level GS vs. pixel voltage PV and obtain corresponding pixel voltages by executing the interpolation method and the conventional resistance dividing method respectively. In comparison to the conventional analog to digital converter, the analog to digital converter 20 of the present embodiment can effectively resolve the shortcomings of the conventional technology such as the circuit area being too large, the cost being too high and the error of pixel voltage being too large.

Figure 3:
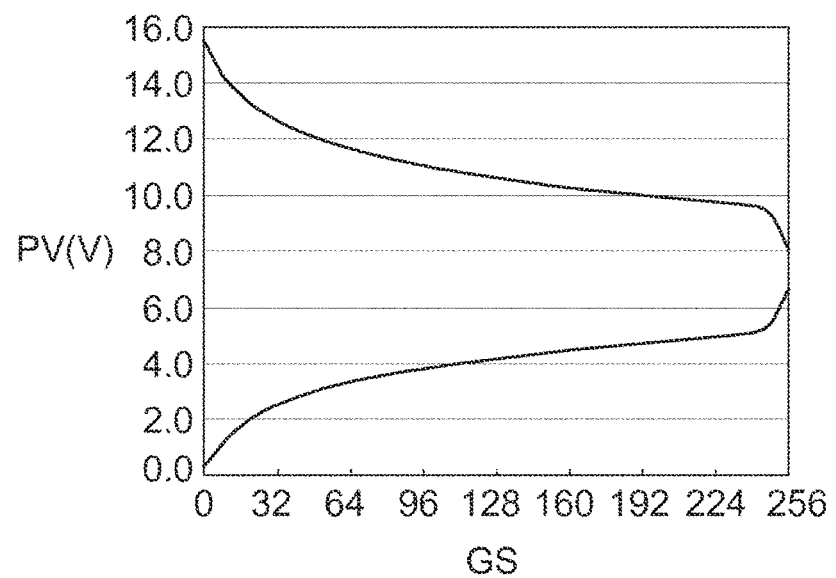
FIG. 3 shows a Gamma curve of grey level GS vs. pixel voltage PV according to an embodiment of the invention.

Referring to FIG. 3, a Gamma curve of grey level GS vs. pixel voltage PV according to an embodiment of the invention is shown. In an operating example, k is equal to 7. In other words, the grey level GS has 8 bits DT0, DT1, ..., DT7, and corresponds to a range having $2^8$ (=256) values. In the present example, the Gamma curve is more linear when the value of the grey level GS ranges between 32~224 and is more non-linear when the value of the grey level is smaller than 32 or larger than 224. Thus, the first value group of the grey level GS of the present embodiment such as includes values 0~31 and value 224~255, and the second value group of the grey level GS such as includes values 32~223.

The decoding operation of the decoding device 21 is exemplified below. The k bits DTk–1~DTk0 of the grey level GS are divided into 4 groups according to the sequence of the k bits. Each of the groups includes w most significant bits (MSBs) DTk–1~DTk–w, x MSBs DTk–w–1~DTk–w–x, y MSBs DTk–w–x–1~DTk–w–x–y, and z MSBs DTk–w–x–y–1~DTk–w–x–y–z, wherein, w, x, y and z are natural numbers satisfying the condition: w+x+y+z≤k. The sub-decoding units of the decoding device 21 respectively implement the decoding operation according to the above 4 groups of bits.

Figure 4A:
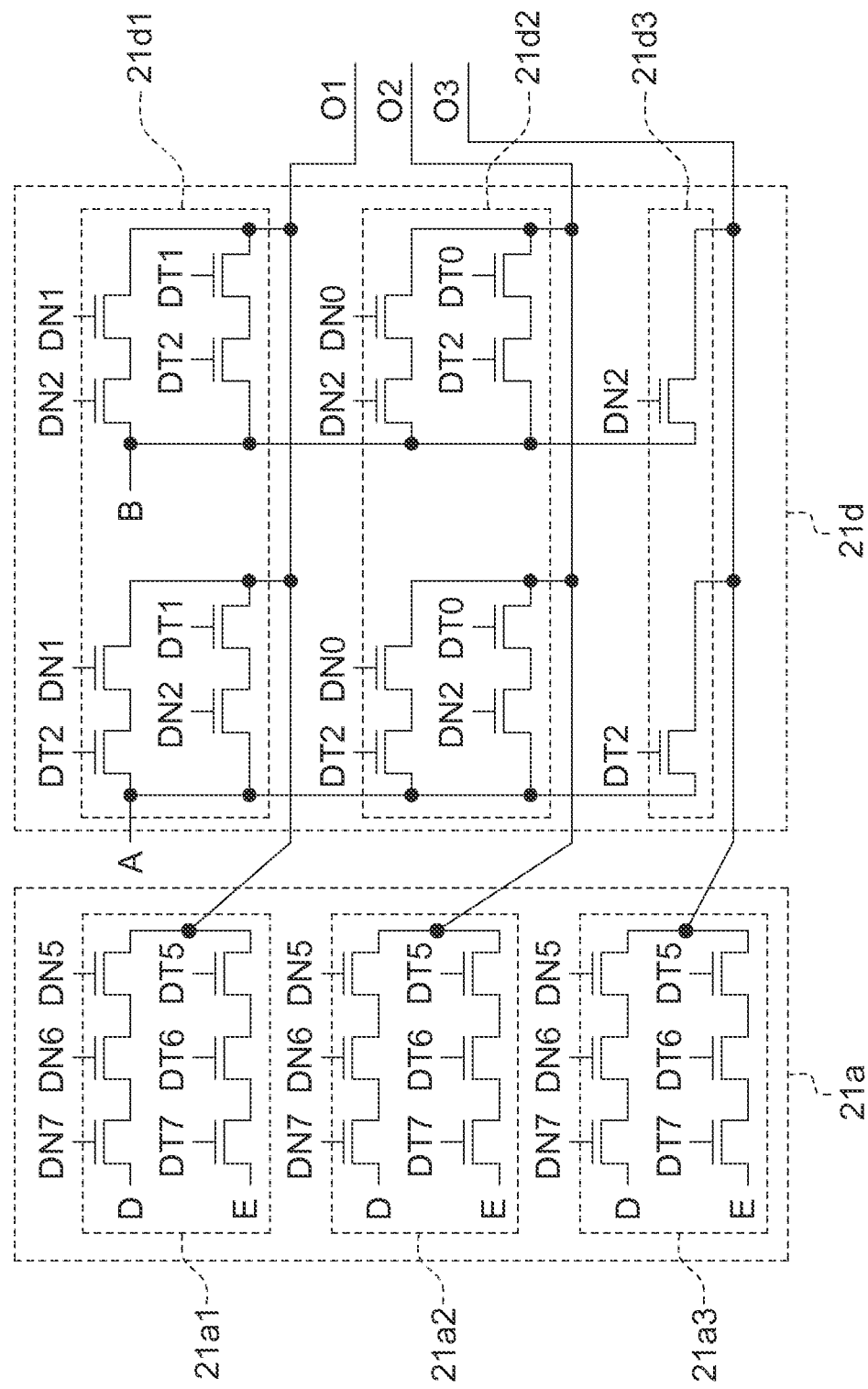
FIGS. 4A~4C show a detailed circuit diagrams of the decoding device 21 of FIG. 1.
Figure 4B:
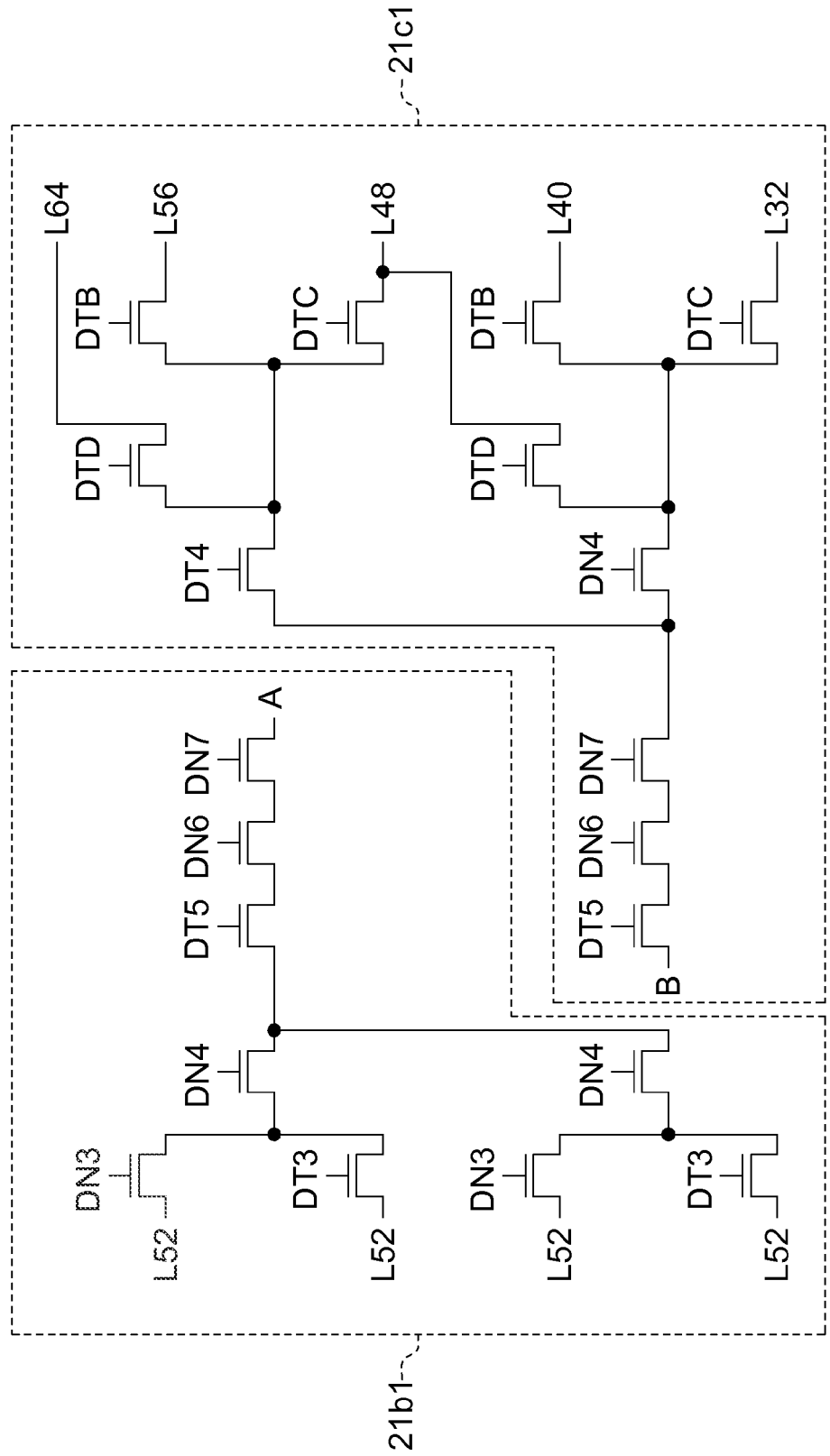
Figure 4C:
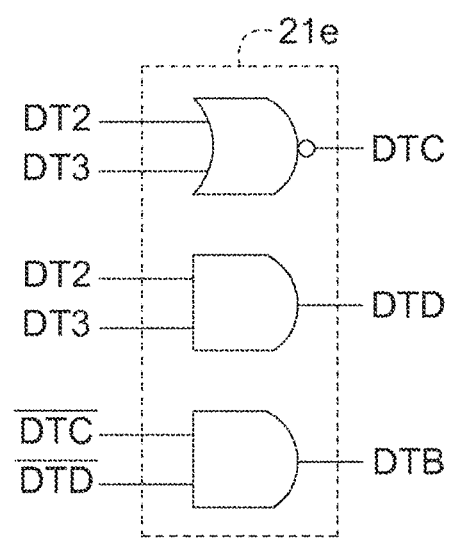

Referring to FIGS. 4A~4C, detailed circuit diagrams of the decoding device 21 of FIG. 1 are shown. For example, the decoding device 21 includes decoding circuits 21*a*, 21*b*, 21*c*, 21*d* and a logic operation circuit 21*e*.

Decoding Circuit 21*a*:

Referring to FIG. 4A. The decoding circuit 21*a* provides output voltages O1, O2 and O3 substantially having the same level when w most significant bits (MSBs) DTk–1, DTk–2, . . . , DTk–w of the grey level GS all correspond to the same logic value. In other words, when the grey level GS corresponds to its $2^{K-w}$ largest values and $2^{k-w}$ smallest values, the decoding device 21 provides the output voltages O1~O3 having the same level.

Let k and w be equal to 8 and 3 respectively be taken for example. When the w (=3) MSBs DTk–1~DTk–w (that is, the bits DT7~DT5) of the grey level GS all correspond to logic value 0, this indicates that the grey level GS corresponds to its 32 (=$2^{k-w}$) smallest values (that is, values (00000000)$_2$ to (00001111)$_2$). In response to the 32 smallest values of the grey level GS, the decoding circuit 21*a* outputs an intermediate voltage D as the output voltages O1~O3, wherein the intermediate voltage D is provided by a sub-decoding circuit (not illustrated) for respectively providing 32 lowest voltage levels L0, L1, L2, . . . , L31 of the pixel voltage PV in response to the 32 smallest values of the grey level GS.

When the 3 MSBs DT7~DT5 of the grey level GS all correspond to logic value 1, this indicates that the grey level GS corresponds to its 32 largest values (11110000)$_2$ to (11111111)$_2$). The decoding circuit 21*a* outputs an intermediate voltage E as the output voltages O1~O3 in response to the 32 largest values of the grey level GS, wherein the intermediate voltage E is provided by a sub-decoding circuit (not illustrated) for respectively providing 32 highest voltage levels L224, L225, L226 . . . , L255 of the pixel voltage PV in response to the 32 largest values of the grey level GS.

Thus, through the operation of the logic circuit 21*a*, the decoding device 21 effectively provides the output voltages O1~O3 having the same level when the value of the grey level GS is within the first value group, such that the analog to digital converter 20 correspondingly does not possess interpolation function.

For example, the decoding circuit 21*a* includes sub-decoding units 21*a*1, 21*a*2 and 21*a*3 including the transistors controlled by the MSBs DT7~DT5 and their inverting signals DN7~DN5. Thus, the sub-decoding units 21*a*1~21*a*3 correspondingly provide the intermediate voltage D or E as the output voltages O1~O3 respectively when the MSBs DT7~DT5 are all equal to value 0 or 1.

Decoding Circuit 21*b*:

Referring to FIG. 4B. The decoding circuit 21*b* provides an intermediate voltage A in response to x MSBs next to the w MSBs DTk–w–1, DTk–w–2, . . . , DTk–w–x (that is, the x MSBs next to the w MSBs) of the grey level GS when the w MSBs DTk–1~DTk–w correspond to different logic values.

Let k, w and x be equal to 8, 3 and 2 respectively be taken for example. When the w (=3) MSBs DT7~DT5 (that is, DTk–1~DTk–w) of the grey level GS correspond to different logic values, the decoding circuit 21*b* provides an intermediate voltage A in response to x (=2) MSBs DTk–w–1~DTk–w–x (that is, the bits DT4 and DT3) next to the MSBs DT7~DT5. In response to the situation that the w MSBs DTk–1~DTk–w may correspond to many different combinations of values, the decoding circuit 21*b* includes $2^w$ (=8) sub-decoding units 21*b*1, 21*b*2, . . . , 21*b*8 used for executing decoding operation with respect to different combinations of values of the 3 MSBs DT7~DT5. Since the operation of each of the sub-decoding units 21*b*1~21*b*8 is substantially similar to each other, the operations of the sub-decoding units 21*b*1~21*b*8 are exemplified by the operation of the sub-decoding unit 21*b*1.

The sub-decoding unit 21*b*1 provides an intermediate voltage A when the MSBs DT7~DT5 respectively correspond to values 0, 0 and 1. When the bits DT4 and DT3 respectively correspond to values 00, 01, 10 and 11, the sub-decoding unit 21*b*1 correspondingly provides voltage levels L36, L44, L52 and L60 for the intermediate voltage A. For example, a true table of the intermediate voltage A is indicated in FIGS. 5A and 5B.

Logic Operation Circuit 21*e*:

Referring to FIG. 4C. The logic operation circuit 21*e* generates logic control signals DTC, DTD and DTB according to x MSBs DTk–w–1~DTk–w–x and y MSBs DTk–w–x–1, DTk–w–x–2, . . . , DTk–w–x–y next to the x MSBs DTk–w–1~DTk–w–x.

Let k, w, x and y be equal to 8, 3, 2 and 1 respectively be taken for example. The logic operation circuit 21*e* executes logic operation according to the MSB DT3 of the x (=2) MSBs DTk–w–1~DTk–w–x (that is, the bits DT4 and DT3) and y MSBs DTk–w–x–1~DTk–w–x–y (that is, the bit DT2). For example, the control signals DTC, DTD and DTB respectively satisfy the following operations:

DTC=DT2 NOR DT3

DTD=DT2 AND $\overline{DT3}$
DTB=$\overline{DTC}$ AND $\overline{DTD}$

For example, a true table of the control signals DTC, DTD and DTB is indicated in FIGS. 5A and 5B.

Decoding Circuit 21*c*:

Referring to FIG. 4B. The decoding circuit 21*c* provides an intermediate voltage B in response to the x MSBs DTk−1−w−1~DTk−w−x and the logic control signals DTC, DTD and DTB when the w MSBs DTk−1~DTk−w correspond to different logic values.

Let k, w and x be equal to 8, 3 and 2 respectively be taken form example. When w (=3) MSBs DTk−1~DTk−w (that is, the bits DT7~DT5) of the grey level GS correspond to different logic values, the decoding circuit 21*c* provides an intermediate voltage B in response to x (=2) MSBs DTk−w−1~DTk−w−x (that is, the bit DT4~DT3) next to the MSBs DT7~DT5 and the control signals DTC, DTD and DTB. In response to the situation that the w MSBs DTk−1~DTk−w may correspond to different combinations of values, the decoding circuit 21*b* includes $2^w$ (=8) sub-decoding units 21*c*1, 21*c*2, ..., 21*c*8 used for executing decoding operation with respect to different combinations of values of the 3 MSBs DT7~DT5. Since the operation of each of the sub-decoding units 21*c*1~21*c*8 is substantially similar to each other, the operations of the sub-decoding units 21*c*1~21*c*8 are exemplified by the operation of the sub-decoding unit 21*c*1.

The sub-decoding unit 21*c*1 provides an intermediate voltage B when the bits DT7~DT5 respectively correspond to values 0, 0 and 1. If the bit DT4 is equal to value 0, then the sub-decoding unit 21*c*1 correspondingly provides voltage levels L32, L40 and L48 for the intermediate voltage B when the control signals DTC, DTB and DTD correspond to values 001, 010 and 100 respectively. If the bit DT4 is equal to value 1, then the sub-decoding unit 21*c*1 correspondingly provides voltage levels L48, L56 and L52 for the intermediate voltage B when the control signals DTC, DTB and DTD correspond to values 001, 010 and 100 respectively. For example, a true table of the intermediate voltage A is indicated in FIGS. 5A and 5B.

Decoding Circuit 21*d*:

Referring to FIG. 4A. When the w MSBs DTk−1-DTk−w correspond to different logic values, the decoding circuit 21*d* selectively has the output voltage O1 equal to one of the intermediate voltages A and B, selectively has the output voltage O2 equal to one of the intermediate voltages A and B, and selectively has the output voltage o3 equal to one of the intermediate voltages A and B according to y MSBs DTk−w−x−1~DTk−w−x−y and z MSBs DTk−w−x−y−1, ..., DTk−w−x−y−z next to the y MSBs DTk−w−x−1~DTk−w−x−y.

Let k, w, x, y and z be equal to 8, 3, 2, 1 and 2 respectively be taken for example. When the MSBs DT7~DT5 correspond to different values, the decoding circuit 21*d* selectively has the output voltages O1~O3 equal to one of the intermediate voltages A and B according to y (=1) MSBs DTk−w−x−1~DTk−w−x−y (that is, the bit DT2) and z (=2) MSBs DTk−w−x−y−1~DTk−w−x−y−z (that is, the bits DT1 and DT0) next to the bit DT2.

The decoding circuit 21*d* includes sub-decoding units 21*d*1, 21*d*2 and 21*d*3 used for determining the output voltages O1, O2 and O3 respectively. When the bits DT1 and DT2 correspond to value 10 or 01, the sub-decoding unit 21*d*1 provides an intermediate voltage A as the output voltage O1. When the bits DT1 and DT2 correspond to value 00 or 11, the sub-decoding unit 21*d*1 provides an intermediate voltage B as the output voltage O1. When the bit DT2 and DT0 correspond to value 10 or 01, the sub-decoding unit 21*d*2 provides an intermediate voltage A as the output voltage O2. When the bits DT2 and DT0 correspond to values 00 and 11, the sub-decoding unit 212*d*2 provides an intermediate voltage B as the output voltage O2. When the bit DT2 corresponds to value 1, the sub-decoding unit 21*d*3 provides an intermediate voltage A as the output voltage O3. When the bit DT2 corresponds to values 0, the sub-decoding unit 212*d*3 provides an intermediate voltage B as the output voltage O3. For example, a true table of the output voltages O1~O3 is indicated in FIGS. 5A and 5B.

Through the operation of the logic circuit 21*e* and the decoding circuits 21*a*~21*d*, the decoding device 21 may correspondingly implement a true table of FIGS. 5A and 5B. Thus, the operational amplifier 22 may correspondingly execute interpolation operation according to the levels of the output voltages O1~O3 and correspondingly finds the corresponding levels L32~L223 of the pixel voltage PV when the value of the grey level GS is one of the values 32~223.

The present embodiment is exemplified by the situation that the bit number k of the grey level GS is equal to 8, and w, x, y and z are equal to 3, 2, 1 and 2 respectively. However, the decoder 31 of the present embodiment is not limited thereto. In other examples, the grey level GS may also include a larger or a smaller bit number, and w, x, y and z can be adjusted accordingly. For example, through the adjustment of the values w and k, the value size (includes $2^{k-w}$ elements) of the first value group can be determined.

The analog to digital converter of the present embodiment uses a decoding unit capable of executing specific logic operation to flexibly divide the values of grey level into groups, and respectively obtain the pixel voltage corresponding to different groups of the values of a grey level by executing substantially different operations. Thus, the analog to digital converter of the present embodiment effectively resolves the shortcomings of the conventional analog to digital converter such as the circuit area being too larger and the cost being too high. Instead, the analog to digital converter of the present embodiment has the advantages of smaller circuit area and lower cost.

With respect to the conventional technology of executing digital to analog conversion on total digital codes by way of interpolation, the analog to digital converter of the present embodiment resolves the shortcomings of the conventional technology such as the error of pixel voltage being too large and the display quality of the liquid crystal display using the same being too poor that may arise when the corresponding Gamma curve is too non-linear. Instead, the analog to digital converter of the present embodiment has the advantages that the error of pixel voltage is lowered and the display quality of the liquid crystal display using the same is improved.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An analog to digital converter generating a plurality of corresponding voltages in response to a plurality of values of a grey level, wherein the grey level includes k bits with k being a natural number larger than 1, and the analog to digital converter comprises:
   a decoding device, comprising:
      a first decoding circuit, for providing a first output voltage, a second output voltage and a third output voltage substantially having the same level when w most significant bits (MSBs) of the grey level all correspond to the same logic value;

a second decoding circuit, for providing a first intermediate voltage in response to x MSBs next to the w MSBs when the w MSBs correspond to different logic values;

a logic operation circuit, for generating a first logic control signal, a second logic control signal and a third logic control signal according to the x MSBs and y MSBs next to the x MSB;

a third decoding circuit, for providing a second intermediate voltage in response to the x MSBs and the first to the third logic control signals when the w MSBs correspond to different logic values; and a fourth decoding circuit, for selectively having the first output voltage equal to one of the first and the second intermediate voltages, selectively having the second output voltage equal to one of the first and the second intermediate voltages, and selectively having the third output voltage equal to one of the first and the second intermediate voltages according to the y MSBs and z MSBs next to the y MSBs when the w MSBs correspond to different logic values; and an operational amplifier, for generating a pixel voltage according to the first to the third output voltages;

wherein, the level of the pixel voltage ranges between the first and the second intermediate voltages when the w MSBs correspond to different logic values;

wherein, w, x, y and z are natural numbers satisfying the condition: $w+x+y+z \leq k$.

2. The analog to digital converter according to claim 1, wherein the logic operation circuit further comprises:

a first operation unit, for generating the first and the second logic control signals respectively according to a result of NOR gate computation of a $(w+x)^{th}$ MSB of the x MSBs and a $(w+x+1)^{th}$ MSB of the y MSBs next to the x MSB and a result of AND gate computation of the $(w+x)^{th}$ MSB of the x MSBs and the $(w+x+1)^{th}$ MSB of the y MSBs next to the x MSB; and a second operation unit, for generating the third logic control signal according to a result of AND gate computation of the inverting signal of the first and the second logic control signals.

3. The analog to digital converter according to claim 1, wherein the first decoding circuit further comprises:

a first sub-decoding unit, for providing a plurality of lowest voltages of the voltages as the first voltage when the w MSBs all correspond to logic value 0, and providing a plurality of highest voltages of the voltages as the first voltage when the w MSBs all correspond to logic value 1.

4. The analog to digital converter according to claim 1, wherein the first decoding circuit further comprises:

a second sub-decoding unit, for providing a plurality of lowest voltages of the voltages as the second voltage when the w MSBs all correspond to logic value 0, and providing a plurality of highest voltages of the voltages as the second voltage when the w MSBs all correspond to logic value 1.

5. The analog to digital converter according to claim 1, wherein the first decoding circuit further comprises:

a third sub-decoding unit, for providing a plurality of lowest voltages of the voltages as the third voltage when the w MSBs all correspond to logic value 0 and providing a plurality of highest voltages of the voltages as the third voltage when the w MSBs all correspond to logic value 1.

6. The analog to digital converter according to claim 1, wherein the fourth decoding circuit further comprises:

a first sub-decoding unit, for providing the first intermediate voltage as the first output voltage when a $(w+x+y)^{th}$ MSB of the y MSBs corresponds to logic value 1, and providing the second intermediate voltage as the first output voltage when the $(w+x+y)^{th}$ MSB corresponds to logic value 0.

7. The analog to digital converter according to claim 1, wherein the fourth decoding circuit further comprises:

a second sub-decoding unit, for providing the first intermediate voltage as the second output voltage when a $(w+x+y)^{th}$ MSB of the y MSBs and a least significant bit (LSB) of the z MSBs correspond to different logic values, and providing the second intermediate voltage as the second output voltage when the $(w+x+y)^{th}$ MSB and the LSB correspond to the same logic value.

8. The analog to digital converter according to claim 1, wherein the fourth decoding circuit further comprises:

a third sub-decoding unit, for providing the first intermediate voltage as the third output voltage when a $(w+x+y)^{th}$ MSB of the y MSBs and a $(w+x+y+1)^{th}$ MSB of the z MSBs next to the y MSBs correspond to different logic values and providing the second intermediate voltage as the third output voltage when the $(w+x+y)^{th}$ MSB and the $(w+x+y+1)^{th}$ MSB correspond to the same logic value.

9. The analog to digital converter according to claim 1, wherein the operational amplifier has three positive input nodes respectively receiving the first output voltage, the second output voltage and the third output voltage, and the operational amplifier obtains the pixel voltage by interpolating the first to the third output voltages.

* * * * *